United States Patent
Shukla et al.

(10) Patent No.: US 8,779,415 B2
(45) Date of Patent: Jul. 15, 2014

(54) DEVICES CONTAINING ORGANIC POLYMERIC MULTI-METALLIC COMPOSITES

(71) Applicants: Deepoak Shukla, Webster, NY (US); Dianne M. Meyer, Hilton, NY (US)

(72) Inventors: Deepoak Shukla, Webster, NY (US); Dianne M. Meyer, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/671,893

(22) Filed: Nov. 8, 2012

(65) Prior Publication Data

US 2014/0124741 A1      May 8, 2014

(51) Int. Cl.
*H01L 21/31* (2006.01)
*H01L 21/469* (2006.01)
*H01L 51/30* (2006.01)

(52) U.S. Cl.
USPC ............ 257/40; 257/E51.007; 257/E51.043; 257/E51.004; 257/E51.045; 257/E27.117; 438/99

(58) Field of Classification Search
USPC ............ 257/40, E51.007, E51.043, E51.044, 257/E51.045, E27.117; 438/99
See application file for complete search history.

(56) References Cited

U.S. PATENT DOCUMENTS

| | | | |
|---|---|---|---|
| 6,232,157 B1 | 5/2001 | Dodabalapur et al. | |
| 6,617,609 B2 | 9/2003 | Kelley et al. | |
| 7,279,777 B2 | 10/2007 | Bai et al. | |
| 7,352,000 B2 | 4/2008 | Kelley et al. | |
| 7,382,041 B2 | 6/2008 | Okada et al. | |
| 7,482,625 B2 | 1/2009 | Kim et al. | |
| 7,792,406 B2 | 9/2010 | Kambe et al. | |
| 2004/0180988 A1 | 9/2004 | Bernius et al. | |
| 2006/0041096 A1 | 2/2006 | Shin et al. | |
| 2007/0181873 A1 | 8/2007 | Moon et al. | |
| 2007/0196663 A1* | 8/2007 | Schwartz et al. | 428/411.1 |
| 2009/0166613 A1 | 7/2009 | Lee et al. | |
| 2009/0224234 A1 | 9/2009 | Kim et al. | |
| 2009/0267058 A1 | 10/2009 | Namdas et al. | |

(Continued)

FOREIGN PATENT DOCUMENTS

| | | |
|---|---|---|
| JP | 2002-110999 | 4/2002 |
| JP | 2003-338551 | 11/2003 |
| KR | 2007-0084643 | 2/2006 |

OTHER PUBLICATIONS

M. Ralik, et al., "High-mobility organic thin-film transistors based on α,α'-didecyloligothiophenes", Journal of Applied Physics, Mar. 2003, vol. 93, No. 5, pp. 2977-2981.

J. Park, et al., "Pentacene TFT With Reduced Threshold Voltage Using PMMA-co-MAA/Sol-Gel-Derived $TiO_2$ Composite Insulator", IEEE Electron Device Letters, vol. 30, No. 11, Nov. 2009, pp. 1146-1148.

(Continued)

*Primary Examiner* — Victor A Mandala
(74) *Attorney, Agent, or Firm* — J. Lanny Tucker

(57) ABSTRACT

Organic polymeric multi-metallic alkoxide or aryloxide composites are used as dielectric materials in various devices with improved properties such as improved mobility. These composites comprise an organic polymer comprising metal coordination sites, and multi-metallic alkoxide or aryloxide molecules that are coordinated with the organic polymer, the multi-metallic alkoxide or aryloxide molecules being represented by:

$(M)_n(OR)_x$ wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

18 Claims, 2 Drawing Sheets

(56) References Cited

U.S. PATENT DOCUMENTS

2010/0003428 A1* 1/2010 Desrousseaux et al. ... 428/32.34
2010/0051917 A1   3/2010 Kippelen et al.
2011/0110986 A1* 5/2011 Schwartz et al. ............. 424/400
2012/0161358 A1* 6/2012 Al-Munif et al. ............. 264/234

OTHER PUBLICATIONS

D. Shukla, et al., "Organic Polymeric Multi-Metallic Composites", U.S. Appl. No. 13/671,854, filed Nov. 8, 2012.

* cited by examiner

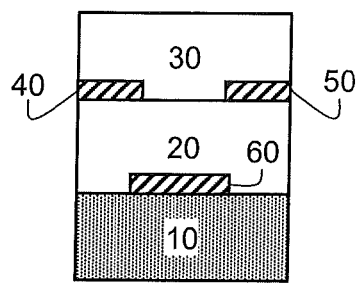
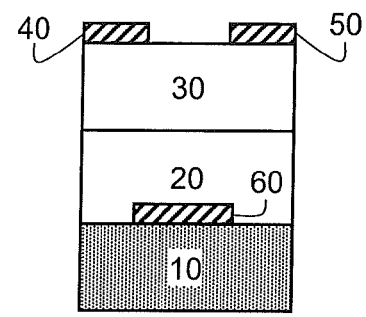
FIG. 1a  FIG. 1b
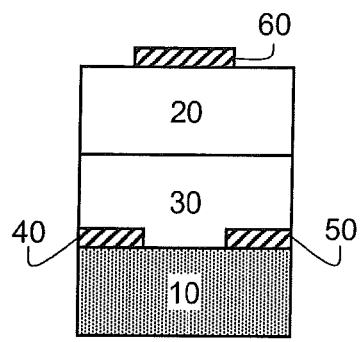
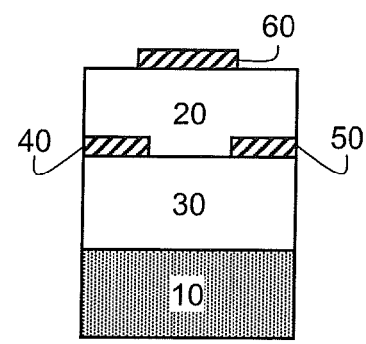
FIG. 1c  FIG. 1d

DEVICES CONTAINING ORGANIC POLYMERIC MULTI-METALLIC COMPOSITES

RELATED APPLICATION

Reference is made to copending and commonly assigned U.S. application Ser. No. 13/671,854, filed on Nov. 8, 2012, by Shukla, Meyer, Mis, and Dirmyer, and is entitled ORGANIC POLYMERIC MULTI-METALLIC COMPOSITES.

FIELD OF THE INVENTION

This invention relates to various devices containing organic polymer-multi-metallic alkoxide or aryloxide composites as dielectric materials. Useful devices include thin film transistors. It also relates to a method for making these making these devices containing the composites.

BACKGROUND OF THE INVENTION

A typical field effect transistor (FET) comprises a number of layers and they can be configured in various ways. For example, an FET may comprise a substrate, a dielectric, a semiconductor, source and drain electrodes connected to the semiconductor and a gate electrode. When voltage is applied between the gate and source electrodes, charge carriers are accumulated in the semiconductor layer at its interface with the dielectric resulting in the formation of a conductive channel between the source and the drain and current flows between the source and the drain electrode upon application of potential to the drain electrode.

FET's are widely used as a switching element in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. Presently, most thin film devices are made using amorphous silicon as the semiconductor. Amorphous silicon is a less expensive alternative to crystalline silicon. This fact is especially important for reducing the cost of transistors in large-area applications. Application of amorphous silicon is limited to low speed devices, however, since its maximum mobility (0.5-1.0 $cm^2/V \cdot sec$) is about a thousand times smaller than that of crystalline silicon.

Although amorphous silicon is less expensive than highly crystalline silicon for use in TFT's, amorphous silicon still has its drawbacks. The deposition of amorphous silicon, during the manufacture of transistors, requires relatively costly processes, such as plasma enhanced chemical vapor deposition and high temperatures (about 360° C.) to achieve the electrical characteristics sufficient for display applications. Such high processing temperatures disallow the use of substrates, for deposition, made of certain plastics that might otherwise be desirable for use in applications such as flexible displays.

In the past two decades, organic materials have received significant attention as a potential alternative to inorganic materials, such as amorphous silicon, for use in semiconductor channels of FET's. Compared to inorganic materials, that require a high-temperature vacuum process, organic semiconductor materials are simpler to process, especially those that are soluble in organic solvents and, therefore, capable of being applied to large areas by far less expensive processes, such as roll-to-roll coating, spin coating, dip coating and microcontact printing. Furthermore organic materials may be deposited at lower temperatures, opening up a wider range of substrate materials, including plastics, for flexible electronic devices. Accordingly, thin film transistors made of organic materials can be viewed as a potential key technology for plastic circuitry in display drivers, portable computers, pagers, memory elements in transaction cards, and identification tags, where ease of fabrication, mechanical flexibility, and/or moderate operating temperatures are important considerations. However, to realize these goals, OFET semiconductor and dielectric components should ideally be easily manufactured using high-throughput, atmospheric pressure, solution-processing methods such as spin-coating, casting, or printing.

To date in the development of organic field effect transistors (OFET's) considerable efforts have been made to discover new organic semiconductor materials and optimizing properties of such materials. The overall performance of an OFET is dependent on a number of factors such as the degree of crystallization and order of organic semiconductor layer, charge characteristics and trap density at the interfaces between dielectric and organic semiconductor layers, carrier injection ability of the interfaces between source/drain electrodes and organic semiconductor layers. Although, the gate dielectric layer is intended to ensure a sufficiently good electrical insulation between the semiconductor and the gate electrode it plays an important role in the overall performance of an OFET. In particular, the gate dielectric permits the creation of the gate field and the establishment of the two-dimensional channel charge sheet. Upon application of a source-drain bias, the accumulated charges move very close to the dielectric-semiconductor interface from the source electrode to the drain electrode. Since the charge flow in organic semiconductor occurs very close (~1 nm) to the dielectric interface, it is important to optimize chemical and electrical behavior of the dielectric layer.

Besides these factors, the dielectric surface morphology has a great effect on carrier or charge mobility of the semiconductor. The surface morphology of the dielectric material and variations in its surface energies [for example, surface treatment via self-assembled monolayers (SAMs)] have been shown to modify the growth, morphology, and microstructure of the vapor/solution-deposited semiconductor, each of these being a factor affecting mobility and current on/off ratio, the latter being the drain-source current ratio between the "on" and "off" states, another important device parameter. The properties of the dielectric material can also affect the density of state distribution for both amorphous and single-crystal semiconductors.

Gate dielectric materials for OFET's can be divided into inorganic and organic materials. Inorganic dielectric materials like silicon oxide ($SiO_2$), silicon nitride ($SiN_x$), aluminum oxide ($AlO_x$), and tantalum oxide ($TaO_x$) are conventionally deposited via chemical vapor deposition (CVD) and plasma enhanced CVD methods which are high temperatures (>300° C.) processes and not compatible with polymeric substrates. Lower processing temperatures usually lead to poor quality films with pinholes, resulting in poor insulating properties. As a result it is necessary to use thick layers (more than 100 nm) to ensure sufficiently good insulator properties which results in increased supply voltages for operation of such circuits. Another widely used process is ion beam deposition, but it needs high vacuum and expensive equipment that are incompatible with the goal of very low cost production. Similarly, use of other high dielectric constant inorganic materials as barium zirconate titanate (BZT, $BaZrTiO_3$) and barium strontium titanate (BST, $BaSrTiO_3$) need either a high firing temperature (400° C.) for the sol-gel process, or radiofrequency magnetron sputtering, which also requires vacuum equipment, and can also have stoichiometric problems.

In addition to higher temperature processing, inorganic insulating layers generally require interfacial modification before they can be used with an organic semiconductor. It has been shown that the presence of polar functionalities (like —OH groups on $SiO_2$ surface) at the dielectric-organic semiconductor interface trap charges which results in lowers carrier mobility in organic semiconductors.

Most organic materials used in OFET's cannot withstand the high processing temperatures used with conventional inorganic materials. For example, the 200° C. or higher temperatures needed to process conventional inorganic materials would at the very least cause a polymeric substrate to deform, and might cause further breakdown of the polymer or even ignition at high enough temperatures. Deformation is highly undesirable, since each layer of the structure has to be carefully registered with the layers below it, which becomes difficult to impossible when the layers below it are deformed due to processing temperatures.

As an alternative to inorganic gate dielectrics, insulating polymers have been proposed for fabrication of OFET's, including poly(4-vinyl phenol) (PVP), poly(methyl methacrylate) (PMMA), poly(styrene) (PS), poly(perfluorobutenylvinylether) (CYTOP), and poly(acrylic acid) (PAA). U.S. Pat. No. 7,298,023 (Guillet et al.) discloses use of organic insulator (or dielectric) comprising a base polymer of PVDC-PAN-PMMA copolymer with the general formula $(-CH_2Cl_2-)_x-CH_2CH(CN)-)_y-(CH_2C(CH_3)(CO_2CH_3))_z$, wherein x, y, z, in each case, independently from one another, can assume values between 0 and 1 for use in OFETs and organic capacitors. However, the presence of polar groups at the dielectric interface can create dipolar disorder which lowers the carrier mobility. U.S. Patent Application 2008/0283829 (Kim et al.) relates to an organic insulator composition including a crosslinking agent and a hydroxyl group-containing oligomer or hydroxyl group-containing polymer is provided. However, the presence of hydroxyl groups at the organic semiconductor-gate dielectric interface is not desirable as hydroxyl groups trap charges.

U.S. Pat. No. 6,232,157 (Dodabalapur et al.) relates to the use of polyimide as material for organic insulating films, but such insulating films require a high temperature heat treatment to obtain chemical resistance.

U.S. Pat. No. 6,617,609 (Kelley et al.) relates to coating a thin siloxane polymeric layer on a gate dielectric (that is usually $SiO_2$). Device performance was shown to improve when a siloxane polymeric layer was present but this approach is limited in scope since it requires inorganic oxide gate dielectrics (claim 11). Moreover, the siloxane polymer is not on top of an organic polymer gate dielectric. Similarly, U.S. Pat. No. 7,352,000 (Kelley et al.) relates to an OFET comprising a thin substantially nonfluorinated polymeric layer interposed between a gate dielectric and an organic semiconductor layer. Although this publication mentions polymeric gate dielectric materials such as poly(vinylidene fluoride) (PVDF), cyanocellulose, polyimides, and epoxies, it specifically teaches the use of inorganic materials for the gate dielectric, and requires the coating of multiple layers, which is difficult and costly.

U.S. Patent Application Publication 2009/0166613 (Lee et al.) describes a composition for forming a gate insulating layer of an OFET comprising a polyacrylate dielectric and pentacene as semiconductor with mobilities in the range of 0.19-0.25 $cm^2/V·s$., which are significantly lower than those reported by Park et al., *Thin Solid Films* 515, 4041-4044 (2007).

U.S. Pat. No. 7,279,777 (Bai et al.) describes cyano-functional polymers for $Al_2O_3$ dielectric surface modification and OFET devices.

Since these polymer dielectrics are not crosslinked, the resulting dielectric film cannot be subjected to any processes involving the use of solvents. To address this problem various cross linked polymer dielectrics have been developed for example as described by Halik et al. [*Journal of Applied Physics* 93, 2977 (2003)]. In addition, U.S. Pat. No. 7,482,625 (Kim et al.) describes blending polyvinyl phenol with another polymer for certain physical, chemical and electrical characteristics. However, this approach has limited application since a high temperature of about 200° C. is required to attain crosslinking.

Low operating voltage is essential for various OFET's applications, such as portable displays, smart cards, and radio frequency identification tags. Furthermore, patchable electronics such as smart patches and smart textiles must be operated at low voltages because they are worn on the human body. To operate at low voltage, OFET's must have a dielectric layer with high dielectric constant. For example, ferroelectric insulators, such as $BaSrTiO_3$ (BST)), $Ta_2O_5$, $Y_2O_3$, and $TiO_2$ and inorganic insulators, such as $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$, and $Bi_4Ti_3O_{12}$ have been used as materials for inorganic insulating films. However, these inorganic oxide materials do not have any significant advantages over conventional silicon materials in terms of processing.

Polymer materials are usually not appropriate for use in low voltage applications due to their low dielectric constant (k). There have been many attempts to obtain a high capacitance with gate dielectrics by reducing their thickness or using polymer-inorganic composites to increase the dielectric constant (k) to produce low voltage operating OFET's For example, Japanese Patent 3,515,507 (Aoki et al.) discloses an organic polymer and an inorganic material that are mixed to provide insulating film with flexibility and high dielectric constant. In accordance with this reference, a powder obtained by mechanically grinding a ferroelectric material such as barium titanate is dispersed in an organic polymer to compensate the dielectric constant of the resulting insulated gate film and hence lower the gate voltage required for the operation of OFET. However, when this method is used, the thickness of the insulating film is limited to the size of the inorganic material thus ground. Furthermore, since a solid material is dispersed in an organic polymer solution, an uneven dispersion is formed, possibly causing the generation of local electric field and concurrent dielectric breakdown during the operation of transistor. Importantly, since the inorganic material is merely present in the organic polymer and thus does not compensate the chemical resistance of the insulating film, the resulting insulating film cannot be subjected to any processes involving the use of solvents.

Japanese Patent Publication 2003-338551 (Shindo) discloses a technique of forming a thin ceramic film as an insulating film on the surface of silicon wafer by a sol-gel method allowing a low temperature treatment. The resulting thin ceramic film can be prevented from being cracked, making it possible to efficiently produce electronic parts having a high reliability. However, the thin ceramic film is an insulating film made of an inorganic material that can be applied to silicon wafer, which is nonflexible and hard, but it cannot be applied to flexible substrates.

U.S. Patent Application 2010-0230662 (Chen et al.) discloses gate insulating layer comprising an azole-metal complex compound. However, pentacene based OFET having an azole-metal complex compound as a dielectric shows lower mobility and poor current on/off ratio.

U.S. Patent Application 2010-0051917 (Kippelen et al.) discloses embodiments of OFET's having a gate insulator layer comprising organic polymer, specifically poly(vinyl phenol) (PVP), nanocomposites incorporating metal oxide nanoparticles (for example, barium titanate (BaTiO$_3$), strontium titanate (SrTiO$_3$), and barium zirconium titanate (BaZrTiO$_3$)) coated by organic ligands and methods of fabricating such OFET's.

Usually dispersions of metal oxide nanoparticles in a polymer matrix are not homogeneous. In an attempt to obtain a uniformly dispersed organic-inorganic mixture system as an ordinary material technique, it has been practiced to prepare a composite film from a mixture of a solution of metal alkoxide that is a precursor of inorganic oxide and an organic polymer solution by a sol-gel method. In this case, it is expected that as the dispersion of organic polymer is made more on monomolecular level, the thermal stability of the organic polymer is more enhanced. Thus, when a polymer or molecules capable of making hydrogen bond such as hydroxyl group or electrostatic mutual action are present in a metal alkoxide solution, a sol-gel polycondensation is formed selectively on the surface of the compound to form a dried gel.

A composite film of poly(methyl methacrylate-co-methacrylic acid) (PMMA-co-MAA)/sol-gel-derived TiO$_2$ has been used as gate dielectric layer in pentacene based OFET's. However, surface roughness of such films is quite high (about 2.1 nm). In the case of deposition of small semiconductor molecules, such as pentacene, molecular orientation and grain morphology depend strongly on the surface roughness and energy of the underlying film. Surface smoothness of poly(4-vinylphenol)-composite is better (about 1.3 nm) and pentacene OFETs show smaller threshold voltage (Kim et al. *J. Am. Chem. Soc.* 132, 14721, 2010).

Korean Patent Publication 2007-0084643 (Kim et al.) discloses a gate dielectric composition wherein the gate insulating layer may be formed of typical organic and/or inorganic compounds. Examples of such organic compounds include poly(vinyl phenol), poly(methyl methacrylate), polyacrylate and poly(vinyl alcohol), and examples of inorganic compounds include SiNx (0<x<4), SiO$_2$ or Al$_2$O$_3$. A poly(vinyl phenol) copolymer mixed with a crosslinking agent and an organic-inorganic hybrid insulator can be used. On top of the gate insulating layer a thin film of a fluorine-based polymer can be applied. This publication teaches the use of poly(methyl methacrylate) and a polyacrylate as a dielectric material but it requires coating a thin film of fluorine containing polymer on top of it.

U.S. Patent Application Publication 2009/0224234 (Kim et al.) discloses a photocurable inorganic/polymer composite including metal oxide nanoparticles by mixing a metal oxide precursor and a photocurable transparent polymer, and converting a part of the organic film into nano-inorganic particles through sol-gel and photocuring reactions. However, a strong protic acid (nitric acid) or a base like sodium hydroxide is required as catalyst to carry out sol-gel reaction in thin film. This method introduces mobile ionic impurities in dielectric layer that could be problematic in electrical applications.

Although various polymer dielectric compositions are known, a number of problems still remain in terms of the process of making such dielectric layers and improving overall performance in OFET's. As discussed before, to increase the dielectric constant of polymer dielectric materials, a number of polymer-inorganic composites, by adding metal oxide nanoparticles and making metal oxide nanoparticles by sol-gel method, are known. However, these methods do not result in crosslinking of the dielectric layer, which is a key requirement in solution processable OFET's. To achieve crosslinking photocurable resins have to be used.

Thus, there is a need to increase the dielectric constant of a polymeric dielectric layer and to provide crosslinking so that solution processing is possible. With the difficulty in balancing all desired properties in mind, there continues to be research to find such useful polymeric dielectric materials for the preparation of various electrical devices.

SUMMARY OF THE INVENTION

The present invention provides a device comprising a layer comprising an organic polymeric multi-metallic alkoxide or aryloxide composite, comprising:

an organic polymer comprising metal coordination sites, and multi-metallic alkoxide or aryloxide molecules that are coordinated with the organic polymer, the multi-metallic alkoxide or aryloxide molecules being represented by:

$$(M)_n(OR)_x$$

wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

A method of this invention for preparing an electronic device comprises:

independently applying a dielectric composition and an organic semiconductor composition to a substrate so that, when dried, the applied dielectric composition forms a single dielectric layer that is in physical contact with the applied organic semiconductor composition, wherein the dielectric composition consists essentially of an organic polymeric multi-metallic alkoxide or aryloxide composite in an organic solvent, the organic polymeric multi-metallic alkoxide or aryloxide comprises:

an organic polymer comprising metal coordination sites, and multi-metallic alkoxide or aryloxide molecules that are coordinated with the organic polymer, the multi-metallic alkoxide or aryloxide molecules being represented by:

$$(M)_n(OR)_x$$

wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

In addition, a process of this invention for fabricating a thin-film semiconductor device, comprises:

providing a substrate, providing a gate electrode material over the substrate, providing an organic film-forming polymer dielectric gate layer over the gate electrode material, depositing a thin film of an organic semiconductor material, and providing a source electrode and a drain electrode contiguous to the thin-film of the organic semiconductor material, wherein the organic film-forming polymer dielectric gate layer consists essentially of an organic polymeric multi-metallic alkoxide or aryloxide composite that comprises:

an organic polymer comprising metal coordination sites, and multi-metallic alkoxide or aryloxide molecules that are coordinated with the organic polymer, the multi-metallic alkoxide or aryloxide molecules being represented by:

wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

In other embodiments of this invention, a method for preparing a thin film transistor device comprises:

making a multi-metallic alkoxide or aryloxide solution, adding the multi-metallic alkoxide or aryloxide solution to an organic polymer solution and mixing to provide an organic polymeric multi-metallic alkoxide or aryloxide composite solution, coating the organic polymeric multi-metallic alkoxide or aryloxide composite solution onto a electrically conducting substrate, heating the coated organic polymeric multi-metallic alkoxide or aryloxide composite to remove solvent to form a gate dielectric layer, depositing an organic semiconductor compound on the gate dielectric layer to form an organic semiconductor layer, and depositing a plurality of sets of electrically conductive source and drain electrodes on the organic semiconductor layer.

The present invention provides various devices comprising unique organic polymeric multi-metallic alkoxide or aryloxide composites as dielectric materials, including associated semiconductor devices that address various deficiencies and shortcomings in organic polymers used as dielectric layers known in the art. The present invention uses novel polymer-inorganic composites and methods that improve the properties of organic field effect transistors (OFET's) including n-type or p-type organic field effect thin film transistors, using improved dielectric materials. The resulting thin film devices of this invention can be readily manufactured using low-cost processes.

Thus, the organic polymeric multi-metallic alkoxide or aryloxide composites used in this invention increase the dielectric constant of the resulting dielectric layers and because they are crosslinked materials, the resulting dielectric layers in OFET's can be solution processed.

In some embodiments, the present invention utilizes an organic polymeric-inorganic composite dielectric material in organic electronic components such as the OFET's as well as a capacitor. The method of this invention provides a way to make an OFET by providing a substrate, forming a gate electrode on the substrate, forming a gate dielectric on the gate electrode using the inventive organic film-forming polymer in a dielectric layer (for example, having a thickness less than 1 µm) interposed between the gate electrode and an organic semiconductor layer, depositing an organic semiconductor layer adjacent to the polymeric layer, and depositing a source electrode and a drain electrode contiguous to the organic semiconductor layer on the substrate.

These advantages are provided by the unique organic multi-metallic alkoxide or aryloxide composites described herein that have many desired properties.

Other advantages of the present invention would be readily apparent to a skilled worker in view of the following detailed description of the present invention.

BRIEF DESCRIPTION OF THE DRAWINGS

FIGS. 1a through 1d illustrate cross-sectional views of four possible configurations for an organic field effect transistor that is one embodiment of the present invention. FIGS. 1a and 1b illustrate a device having a bottom gate configuration and FIGS. 1c and 1d illustrate a device having a top gate configuration.

DETAILED DESCRIPTION OF THE INVENTION

Definitions

Figure 2A:
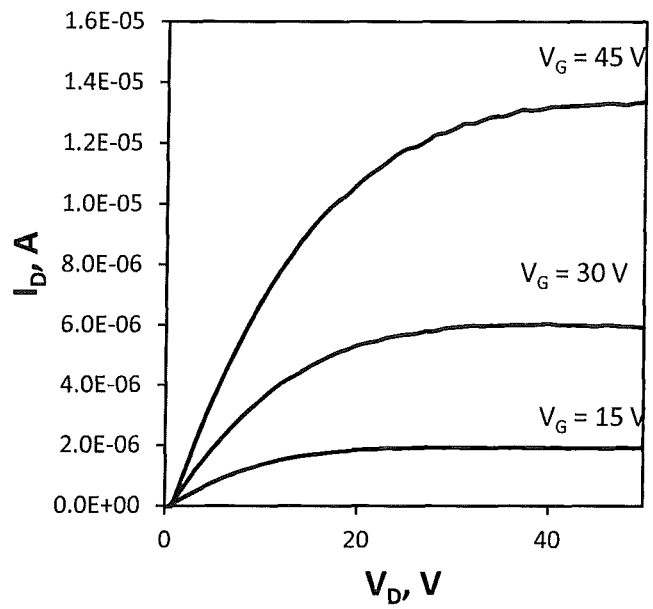
FIGS. 2a and 2b are graphical representations of the output and transfer characteristics of the device described below in Invention Examples 10 and 11.

As used herein to define various components of the composites, dielectric compositions, semi-conductor compositions and layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

As used herein, the terms "over," "above," and "under" and other similar terms, with respect to layers in the devices of this invention, refer to the order of the layers, wherein the organic thin film layer is above the gate electrode, but do not necessarily indicate that the layers are immediately adjacent or that there are no intermediate layers.

Unless otherwise noted in this application, the term "composite" refers to an organic polymeric multi-metallic alkoxide or aryloxide composite used in the devices of this invention.

Moreover, unless otherwise indicated, percentages refer to percents by total dry weight, for example, weight % based on total solids of either a layer or formulation used to make a layer. Unless otherwise indicated, the percentages can be the same for either the dry layer or the total solids of the formulation used to make that layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

The term "polymer" refers to high and low molecular weight polymers including oligomers and includes homopolymers and copolymers. The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Periodic Table refers to the well known chemical arrangement of chemical elements.

The above described features and advantages of the present invention will become more apparent when taken in conjunction with the following description and drawings wherein identical reference numerals have been used, where possible, to designate identical or analogous features that are common to the Figures.

Organic Polymeric Multi-Metallic Alkoxide/Aryloxide Composites

The composites used in this invention comprise one or more organic polymers, each of which comprises metal coordination sites for the metals described below. Such coordination sites include but are not limited to, inorganic and organic groups that are generally pendant to the organic backbone of the polymers. Examples of inorganic groups include but are not limited to, siloxane and phosphoric esters. Examples of organic groups include but not limited to, amines, pyridines, alkoxy, carbonyls, esters, ethers, carboxylic acids, and aromatic groups that are pendant to the organic polymer backbone or within the backbone itself. A given organic polymer can have more than one type of metal coordination site. Particularly useful metal coordination sites are esters, ethers, carbonyl, and pyridine groups.

Useful classes of organic polymers with metal coordination sites include but are not limited to, polystyrenes including halogenated polystyrenes, hydroxylated polystyrenes and other organic polymers derived from styrene derivatives, organic polymers derived from one or more of (meth)acrylic acid, (meth)acrylamide, alkyl (meth)acrylates, propylene oxide, and other ethylenically unsaturated polymerizable monomers that a skilled artisan would be able to choose. For example, poly(methyl methacrylate) (PMMA) and organic copolymers derived from methyl methacrylate are particularly useful. Other organic polymers that are useful include but not limited to, aliphatic polycarbonates such as polypropylene carbonate) and poly(ethylene carbonate), polyesters, polyimides, polyamides, polysulfones, polylactides, polylactones, poly(arylene ethers), polyphenylenes, poly(phenyl quinoxalines), poly(vinyl alcohol), poly(vinyl acetate), poly (methyl methacrylate), poly(vinyl phenol), poly(vinyl cinnamate), poly (2-vinyl pyridine), and poly (4-vinyl pyridine). Still other useful organic polymers are poly(styrene-co-alpha-methyl styrene) and poly(styrene-ethylene oxide).

Such useful organic polymers can be obtained from various commercial sources or they are readily prepared by polymer chemists using readily available reaction materials and known polymerization conditions.

Other useful polymers comprising metal coordination sites comprise Structure (A) recurring units as follows:

wherein X represents the organic backbone unit, for example, a carbon-carbon single bond unit that can be unsubstituted or further substituted with one or more halo atoms or alkyl groups having 1 to 3 carbon atoms. In addition, X can represent the repeating unit of a polyester, polyamide, polyurethane, polyimide, polyaryleneoxide, polysulfone, polyether, polyetherketone, or vinyl polymer.

In Structure (A), n is 0 or 1, and in many embodiments of vinyl polymers, n is 1.

G is a substituted or unsubstituted divalent organic linking group that can have least one oxygen, sulfur, or nitrogen heteroatom in the organic linking group chain. For example, useful G groups include but are not limited to, carbonyloxy [—C(=O)—O—], sulfonyloxy [—SO$_2$—O—], oxy dioxy (—O—O—) thio (—S—), dithio (—S—S—), seleno (—Se—), sulfonyl sulfonyl (—SO$_2$—), carbonamido [—C(=O)—NH—], sulfonamide [—SO$_2$—NH—], substituted or unsubstituted arylene (such as substituted or unsubstituted phenylene), substituted or unsubstituted cycloalkylene having 5 to 8 carbon atoms in the chain (such as pentylene, 1,3-hexylene, 1,4-hexylene, and 3-methyl-1,4-hexylene), imido (—NH—), vinylene-carbonyloxy [—CR=CR'—C(=O)—O—] wherein R and R' are independent hydrogen, methyl, or ethyl, acetylimino [CH$_3$C(=O)—N<], alkylenecarbonyloxy [for example, —CH=CH—CH$_2$—C(=O)—O—], alkyleneimino (for example, —CH$_2$—NH—), alkylenecarbonyloxy [for example, —CH$_2$—C(=O)—O—], benzylene, carbonyldioxy [—O—C(=O)—O—], diazo [—N=N—], and ureylene [—NH—C(=O)—NH—]. Combinations of two or more of these listed groups can be used to form a G divalent linking except that oxyarylene groups are excluded. Where chemically possible, any of these groups can be substituted as long as the organic film-forming polymer properties are not adversely affected. The carbonyloxy and substituted or unsubstituted phenylene groups are particularly useful. For any of these groups that can be substituted, suitable substituents include but are not limited to alkyl groups, alkoxy groups, hydroxy groups, carboxy groups, sulfo groups, halo groups, and other substituents, and a skilled worker would know which substituents would be possible so that the dielectric properties of the organic polymeric multi-metallic alkoxide or aryloxide are not adversely affected.

In some embodiments of Structure (A) recurring units, n is 0 or 1 and when n is 1, G is a carbonyloxy group, amide group, substituted or unsubstituted phenylene group, oxy group, or thio group.

In Structure (A), R$^1$ is a substituted or unsubstituted aliphatic group having at least 6 carbon atoms including but not limited to, substituted or unsubstituted, and linear or cyclic monovalent hydrocarbons. Useful monovalent hydrocarbon groups can be saturated or unsaturated but saturated hydrocarbon groups are particularly useful. In addition, the useful R$^1$ monovalent hydrocarbon groups can have at least 12 carbon atoms and up to and including 40 carbon atoms, or typically at least 18 carbon atoms and up to and including 30 carbon atoms in the linear or cyclic group. Linear long-chain alkyl groups, having at least 12 carbon atoms and up to and including 30 carbon atoms in the chain, are particularly useful.

Some particularly useful ethylenically unsaturated polymerizable monomers that can be used to provide recurring units that are represented by Structure (A) and that can be used to prepare organic film-forming polymers of this invention include but are not limited to, hexyl methacrylate, heptyl methacrylate, octyl methacrylate, octadecyl methacrylate, decyl methacrylate, hexadecyl methacrylate, dodecyl methacrylate, cyclohexyl methacrylate, cyclooctyl methacrylate, 4-octylphenyl methacrylate, docosonyl methacrylate, 2-octyl-1-dodecanyl methacrylate, 4-octylcyclohexyl methacrylate, 2-ethylhexyl methacrylate, eicosanyl methacrylate, and corresponding acrylates.

Since these organic polymers can have only up to 25 mol % of recurring units defined by Structure (A), and the remainder of the polymer backbone can have any suitable "additional" recurring units, generally in random order with each other and with the Structure (A) recurring units. These additional recurring units are different than the recurring units defined by Structure (A), in some respect, for example in different linking groups or side chains. In particular, the organic polymers can have at least 75 mol % and up to 99.5 mol %, or typically at least 80 mol % and up to and including 95 mol %, of these additional recurring units in the backbone, based on the total moles of recurring units in the polymer backbone. Such additional recurring units can be derived, for example, from ethylenically unsaturated polymerizable monomers, which monomers can be substituted or unsubstituted. Thus, polymerizable olefins can be used to provide the additional recurring units.

More generally, useful additional recurring units can be defined as those that, when present as the only recurring units in a homopolymer, this homopolymer should have a glass transition temperature ($T_g$) at least 100° C. and up to any temperature that is a practical limit so that the resulting organic polymers have the desired dielectric properties in the devices of this invention. This "homopolymer $T_g$ feature" can be determined using DSC.

The additional recurring units need not be the same throughout the polymer backbone. For example, multiple different recurring units represented by Structure (B) below can be present along the backbone of a particular organic polymer.

In many embodiments, the additional recurring units can be represented by the following Structure (B):

wherein X' is an organic backbone unit that is different than the X organic backbone unit, and it will be define primarily by the type of polymer, whether vinyl polymer, condensation polymer, or other type of polymer.

G' is a divalent organic linking group such as those used in the definition of G except that oxyarylene groups are not excluded for G'. The G and G' groups in a given organic film-forming polymer can be the same or different and for example, in many embodiments G and G' are the same divalent organic linking groups. In some embodiments, at least one of G and G' is a carbonyloxy group, and in other embodiments, both G and G' are carbonyloxy groups.

In Structure (B), m is 0 or 1, and in many embodiments, m is 1.

$R^2$ can represent any aliphatic, aromatic, alicyclic, or cyclic group that would be readily apparent to one skilled in the art as long as the "homopolymer" $T_g$ feature described above is met for the given recurring unit, and generally $R^2$ and $R^1$ are different groups. In many embodiments, $R^2$ is a substituted or unsubstituted, linear or branched, hydrocarbon such as linear or cyclic hydrocarbon groups having 1 to 40 carbon atoms including but not limited to alkyl groups, adamantyl and diadamantyl groups, and carbocyclic aromatic groups.

Some particularly useful ethylenically unsaturated polymerizable monomers that can be used to provide recurring units represented by Structure (B) include but not limited to, 1-diadamantyl methacrylate, 1-adamantyl methacrylate, methyl methacrylate, n-butyl methacrylate, t-butyl methacrylate, n-butyl acrylate, phenyl methacrylate, 2-phenylethyl methacrylate, 1-diadamantyl acrylate, 1-adamantyl acrylate, styrene, 4-methylstyrene, norbornyl methacrylate, 4-t-butylstyrene, 2-vinyl naphthalene, 1-vinyl naphthalene, and 4-vinyl biphenyl.

The organic polymers defined by Structure (A) and optionally Structures (A) and (B) together can be prepared using conventional free radical polymerization techniques with the appropriate starting materials (for example, ethylenically unsaturated polymerizable monomers) and polymerization initiators. Similarly, living free radical polymerization techniques such as atom transfer radical polymerization (ATRP), nitroxide-mediated polymerization (NMP), or reversible addition-fragmentation chain transfer (RAFT) polymerization can be used. Other organic polymers useful in the practice of this invention can be prepared using condensation polymerization techniques with the appropriate starting materials (for example diols and diacids for polyesters). A skilled worker in polymer chemistry would be able to use the description in this application as guidance to prepare any of the organic polymers useful for practice in this invention.

The most useful organic polymers for preparing the composites of this invention are poly(meth)acrylates (both homopolymers and copolymers derived from (meth)acrylate monomers), polyesters, and poly(vinyl pyridines) (both homopolymers and copolymers derived from vinyl pyridines).

The organic polymeric multi-metallic alkoxide or aryloxide also includes multi-metallic alkoxide or aryloxide molecules that are coordinated with the organic polymer. These multi-metallic alkoxide or aryloxide molecules are represented by:

$$(M)_n(OR)_x$$

wherein at least one M is a metal selected from Group 2 of the Periodic Table and at least one other M is a metal selected from any of Groups 3 to 12 and Rows 4 and 5 of the Periodic Table.

Thus, each composite used in the practice of this invention includes one or more molecules selected from at least two different metals. One or more "first" M metals are selected from Group 2 of the Periodic Table including but not limited to, barium, strontium, or calcium, or a combination thereof (two or more of the metals). Barium and strontium are particularly useful Group 2 metals.

The composite also comprises one or more "second" M metals are selected from Group 3 to Group 12 metals in Rows 4 and 5 of the Periodic Table. Particularly useful second M metals include but are not limited to, titanium, zirconium, nickel, copper, zinc, palladium, silver, lanthanum, and combinations thereof (two or more metals). Titanium, zirconium, and zinc (or combinations thereof) are particularly useful metals of this type.

Particularly useful combinations of metals to provide the desired metal alkoxides and metal aryloxides include but are not limited to, barium with titanium, barium with zirconium, strontium with titanium, strontium with zirconium, barium and titanium with zirconium, and barium and strontium with titanium.

In addition, the molar ratio of the one or more M metals selected from Group 2 of the Periodic Table to the one or more M metals selected from any of Groups 3 to 12 of the Periodic Table, in the organic polymeric multi-metallic alkoxide or aryloxide, can be at least 0.5:1 to and including 10:1, or at least 2:1 to and including 1:1.

In the noted structure for the composite, n is an integer of at least 2 and can be at least 2 and up to and including 4.

The composite also includes at least two R groups, which can be the same or different substituted or unsubstituted alkyl groups or substituted or unsubstituted aryl groups. Thus, x is an integer of at least 2 and can be at least 2 and up to and including 4.

The useful substituted or unsubstituted alkyl groups can be linear or branched, cyclic or acyclic, and comprise at least 1 to and including 24 carbon atoms, and typically at least 1 to and including 8 carbon atoms. Representative substituted or unsubstituted alkyl groups include but are not limited to methyl, ethyl, n-propyl, isopropyl, t-butyl, n-hexyl, cyclopentyl, and cyclohexyl. Other particularly useful alkyl groups are substituted or unsubstituted alkyl ethers of ethylene and diethylene glycols including alkyl ethers such as monomethyl ether, monoethyl ether, monopropyl ether, monoisopropyl ether, monobutyl ether, monophenyl ether, and monobenzyl ether. Esters of ethylene glycol and diethylene glycol are also useful in present invention. As noted above, the R groups in the composite can include two or more different substituted or unsubstituted alkyl groups such as a combination of alkyl groups and alkyl ether groups.

Useful substituted or unsubstituted aryl groups in the composite include substituted or unsubstituted carbocyclic aromatic groups having 6 or 10 carbon atoms in the aromatic ring, such as substituted or unsubstituted phenyl, naphthyl, 4-methylphenyl, phenol, 2-methoxyphenol, monophenyl ether, monobenzyl ether, and similar groups.

In particularly useful organic polymeric multi-metallic alkoxide or aryloxide composites, the alkyloxide comprises one or more substituted or unsubstituted alkyl groups having 1 to 24 carbon atoms, or the aryloxide comprises one or more substituted or unsubstituted phenyl groups. Other useful embodiments include both a substituted or unsubstituted alkyl group and a substituted or unsubstituted aryl group.

The organic polymeric multi-metallic alkoxide or aryloxide composites useful in the practice of the present invention can be prepared in any suitable manner, but a particularly useful synthetic method comprises:

mixing a non-aqueous solution of a suitable organic polymer (or a mixture of organic polymers) comprising metal coordination sites with one or more multi-metallic alkoxides or aryloxides in a suitable organic solvent for a suitable time and temperature, and removing the organic solvent, in a suitable manner such as evaporation or other drying means.

For example, the mixing of the organic polymer(s) and multi-metallic alkoxide or aryloxide can be carried out at a temperature of at least 30° C. and up to and including 100° C. In particular, the mixing can be carried out at a temperature of at least 30° C. to and including 60° C.

The mixing of the reactants can be carried out for at least 10 minutes and up to and including 24 hours, usually with stirring or mechanical mixing. Suitable reaction conditions are provided below in the Syntheses before the Invention Examples.

In some embodiments, the organic polymeric multi-metallic alkoxide or aryloxide can be made in the form of a solid film.

In particular embodiments, the organic polymeric multi-metallic alkoxide or aryloxide composite comprises:

an organic polymer comprising metal coordination sites, and multi-metallic alkoxide or aryloxide molecules that are coordinated with the organic polymer, the multi-metallic alkoxide or aryloxide molecules being represented by:

wherein:

the organic polymer comprising metal coordination sites is a poly(meth)acrylate, polyester, or poly(vinyl pyridine), the molar ratio of the M metal selected from Group 2 of the Periodic Table to the M metal selected from any of Groups 3 to 12 of the Periodic Table, is at least 2:1 to and including 1:1, wherein the M metal selected from Group 2 of the Periodic Table is barium, strontium, or calcium, or a combination thereof, the M metal selected from any of Groups 3 to 12 and Rows 4 and 5 of the Periodic Table is titanium, zirconium, nickel, copper, zinc, palladium, silver, lanthanum, or a combination thereof, the alkoxide comprises a substituted or unsubstituted alkyl group having 1 to 8 carbon atoms, and the aryloxide comprises a substituted or unsubstituted phenyl, and n is an integer of at least 2 to and including 4, and x is an integer of at least 2 to and including 4.

Electronic Devices

The present invention provides a method of making an OFET, the method comprising:

providing a substrate, forming a gate electrode on the substrate, forming a composite gate dielectric (according to the present invention) on the gate electrode by applying inventive organic polymeric multi-metallic alkoxide or aryloxide composite (having a thickness less than 1 μm) interposed between the gate electrode and an organic semiconductor layer, depositing an organic semiconductor layer adjacent to the polymer composite layer, and depositing a source electrode and a drain electrode contiguous to the organic semiconductor layer.

Any organic polymeric multi-metallic alkoxide or aryloxide described herein can be used to prepare the gate dielectric layer in the OFET's of the invention, or a combination of two or more of such composites can be used. An integrated circuit comprising a plurality of OFET's is also provided by the present invention.

Any known thin film transistor or field effect transistor configuration is possible with the invention. For example, the source and drain electrodes may be adjacent to the gate dielectric with the organic semiconductor layer over the source and drain electrodes, or the organic semiconductor layer may be interposed between the source and drain electrodes and the gate dielectric. In each option, the invention provides a composite dielectric layer between the organic semiconductor layer and the gate dielectric.

Each organic field effect transistor (OFET) illustrated in FIGS. 1a-1d contains source electrode 40, drain electrode 50, gate electrode 60, gate dielectric 20, substrate 10, and semiconductor organic layer 30 in the form of a film connecting source electrode 40 to drain electrode 50, which organic semiconductor layer comprises a compound as described below. When the OFET operates in an accumulation mode, the charges injected from source electrode 40 into the organic semiconductor layer 30 are mobile and a current flows from source 40 to drain 50, mainly in a thin channel region within about 100 Angstroms of the semiconductor-dielectric interface. In the configuration of FIG. 1a, the charge need only be injected laterally from source electrode 40 to form the channel. In the configuration of FIG. 1b, the charge is injected vertically for source electrode 40 into organic semiconductor layer 30 to form the channel. In the absence of a gate field, the channel ideally has few charge carriers and as a result there is ideally no source-drain conduction.

The off current is defined as the current flowing between source electrode 40 and drain electrode 50 when charge has not been intentionally injected into the channel by the application of a gate voltage. For an accumulation-mode TFT, this occurs for a gate-source voltage more negative, assuming an n-channel, than a certain voltage known as the threshold voltage. The "on" current is defined as the current flowing between source electrode 40 and drain electrode 50 when charge carriers have been accumulated intentionally in the channel by application of an appropriate voltage to gate electrode 60, and the channel is conducting. For an n-channel accumulation-mode TFT, this occurs at gate-source voltage more positive than the threshold voltage. It is desirable for this threshold voltage to be zero or slightly positive for n-channel operation. Switching between on and off is accomplished by the application and removal of an electric field from gate electrode 60 across gate dielectric 20 to the semiconductor-dielectric interface, effectively charging a capacitor.

In accordance with the present invention, the organic polymeric composites can be used to provide dielectric layers (also known as gate dielectrics or gate insulator layers) in the devices described herein, to improve electrical properties, without the need for additional surface treatment or coating another layer on the surface to which the composite formulations are applied.

For example, a gate dielectric or gate insulator layer can be prepared by:

depositing on or applying to a suitable substrate, a liquid formulation can consists essentially of one or more composites described herein and optionally one or more suitable solvents, and removing any solvent from the applied liquid layer to form a solid gate dielectric or gate insulator layer. This process is described in more detail below.

The devices of this invention can comprise the composite dielectric materials described herein and such devices can be electronic device including but not limited to, organic field effect transistors (OFET's), optical devices such as organic light emitting diodes (OLED's), photodetectors, sensors, logic circuits, memory elements, capacitors, and photovoltaic (PV) cells. Particularly useful electronic devices are OFET's that are described in more detail below. However, just because other devices are not described in detail, it is not contemplated that the present invention is useful only as OFET's. A skilled artisan in the various arts would know how to use the polymeric dielectric materials described herein for those other types of devices.

Thus, the present invention also provides a method for the production of an organic polymeric multi-metallic alkoxide or aryloxide composite dielectric layer and electronic devices incorporating such components. In one embodiment, a suitable substrate is provided and a solution or dispersion of the composite of the present invention is applied to the substrate and dried, and suitable electrical contacts are made with the layer. The particular method to be used can be determined by the structure of the desired semiconductor component. In the production of an organic field effect transistor, for example, a gate electrode can be first deposited on a flexible substrate, a solution or dispersion of composite of this invention can then be applied on it to form a dielectric layer, and then source and drain electrodes and a layer of a suitable semiconductor material can be applied on top of the dielectric layer.

The structure of such a transistor and hence the sequence of its production can be varied in the customary manner known to a person skilled in the art. Thus, alternatively in another embodiment, a gate electrode can be formed first, followed by a gate polymer dielectric of the composite of this invention, then the organic semiconductor layer can be formed, and finally the contacts for the source electrode and drain electrode can be formed on the organic semiconducting layer.

A third embodiment can have the source and drain electrodes formed first, then the organic semiconductor layer can be formed, followed by forming the dielectric layer, and a gate electrode can be formed on the dielectric layer.

A skilled artisan would recognize that other useful structures can be constructed or intermediate surface modifying layers can be interposed between the above-described components of the thin film transistor. In most embodiments, a field effect transistor comprises the organic polymeric multi-metallic alkoxide or aryloxide composite dielectric layer, a gate electrode, a organic semiconductor layer, a source electrode, and a drain electrode, wherein the composite dielectric layer, the gate electrode, the organic semiconductor layer, the source electrode, and the drain electrode are arranged in any sequence as long as the gate electrode, and the organic semiconductor layer both contact the organic polymeric multi-metallic alkoxide or aryloxide composite dielectric layer, and the source electrode and the drain electrode both contact the organic semiconductor layer.

Substrate

A substrate (also known as a support) can be used for supporting the OFET or other device of this invention during manufacturing, testing, or use. A skilled artisan would appreciate that a substrate that is selected for commercial embodiments can be different from a substrate that is selected for testing or screening various embodiments. In other embodiments, a temporary substrate can be detachably adhered or mechanically affixed to another substrate. For example, a flexible polymeric substrate can be adhered to a rigid glass substrate that can be removed.

In some embodiments, the substrate does not provide any necessary electrical function (such as electrical conductivity) for the device such as an organic field effect transistor. This type of support is considered a "non-participating support".

Useful substrate materials include both organic and inorganic materials including but not limited to, inorganic glasses, silicon wafer, ceramic foils, polymeric films, filled polymeric materials, coated metallic foils, acrylics, epoxies, polyamides, polycarbonates, polyimides, polyketones, poly (oxy-1,4-phenyleneoxy-1,4-phenylenecarbonyl-1,4-phenylene) [sometimes referred to as poly(ether ether ketone) or PEEK], polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible substrate can be used in some embodiments to allow for roll processing, which can be a continuous process, and providing economy of scale and manufacturing compared to flat or rigid supports. The flexible substrate can be designed to be wrapped around the circumference of a cylinder of less than 50 cm in diameter, or typically less than 25 cm in diameter, without distorting or breaking, using low force. A flexible substrate can be rolled upon itself.

In some devices of the present invention, a substrate is optional. For example, in a top construction as illustrated in FIG. 1b, when the gate electrode or gate dielectric provides sufficient support for the intended use of the resultant TFT, a substrate is not needed. In addition, the substrate can be combined with a temporary support in which the support is detachably adhered or mechanically affixed to the substrate, such as when the support is desired for a temporary purpose, for example, for manufacturing, testing, transport, or storage. Thus, a flexible polymeric temporary support can be adhered to a rigid glass substrate, which flexible polymeric temporary support could be removed at an appropriate time.

Gate Electrode

The gate electrode for the OFET's of this invention can be composed of any useful conductive material. A variety of useful gate materials include but are not limited to, metals, degenerately doped semiconductors, conducting polymers, and printable materials such as carbon ink or a silver-epoxy. For example, the gate electrode can comprise doped silicon, or a metal such as aluminum, chromium, gold, silver, nickel, palladium, platinum, tantalum, or titanium, or mixtures thereof. Conductive polymers also can be used, including but not limited to, polyaniline, polypyrrole, and poly(3,4-ethylenedioxythiophene)/poly(styrene sulfonate) (PEDOT:PSS). In addition, alloys, combinations, and multilayers of these materials can be used in the gate electrode.

In some embodiments of the present invention, the same material can provide the gate electrode function and also provide a supporting (substrate) function. For example, doped silicon can function as the gate electrode and the substrate for an OFET.

Gate Dielectric

The gate dielectric is provided on a gate electrode to electrically insulate the gate electrode from the rest of the electronic device (such as an OFET device). The gate dielectric is provided as a separate layer comprising one or more of the organic polymeric multi-metallic alkoxide or aryloxide composites of this invention. In most embodiments, the dielectric layer consists essentially of one of more of these composites with only non-essential materials as additional components. In yet other embodiments, the dielectric layer consists only of one or more of the composites.

The gate dielectric layers used in this invention exhibit a suitable dielectric constant that does not vary significantly with frequency. The gate dielectric layer can have a resistivity of at least $10^{14}$ ohm-cm for OFET devices.

In some embodiments, the organic polymeric multi-metallic alkoxide or aryloxide composite gate dielectric described herein can possess one or more of the following characteristics: coatability out of solution, crosslinkable, photo-patternable, high thermal stability (for example, stable up to a temperature of at least 250° C.), low processing temperatures (for example, less than 150° C., or less than 100° C.), and compatibility with flexible substrates.

For OFET's for example, the dielectric layer generally has a dry thickness of at least 3,500 Angstroms (Å) and up to and including 15,000 Angstroms (Å), or typically up to and including 10,000 Å, or at least 5,000 Å. The dry thickness can be determined using known methods such as ellipsometry and profilometry. For embedded capacitors and printed circuit board applications, the dry dielectric layer thickness can include those described above for OFET's, but can also be at least 10 μm or at least 20 μm and up to and including 50 μm.

Source and Drain Electrodes

The source electrode and drain electrode are separated from a gate electrode by the gate dielectric while the organic semiconductor layer can be over or under the source electrode and drain electrode. The source and drain electrodes can be composed of any useful conductive material including but not limited to, those materials described above for the gate electrode, for example, aluminum, barium, calcium, chromium, gold, silver, nickel, palladium, platinum, titanium, polyaniline, PEDOT:PSS, graphene, reduced graphene oxide (r-GO), composites of graphene, composites of reduced graphene oxide, other conducting polymers, composites thereof, alloys thereof, combinations thereof, and multilayers thereof.

The thin film electrodes (for example, gate electrode, source electrode, and drain electrode) can be provided by any useful means such as physical vapor deposition (for example, thermal evaporation, sputtering), microcontact printing, or ink jet printing. The patterning of these electrodes can be accomplished by known methods such as shadow masking, additive photolithography, subtractive photolithography, printing, microcontact printing, and pattern coating.

The organic semiconductor layer can be provided over or under the source and drain electrodes, as described above in reference to the thin film transistor article.

Useful materials that can be formed into n-type or p-type organic semiconductor layers are numerous and described in various publications. For example, useful semiconductor materials can be prepared using poly(3-hexylthiophene) (P3HT) and its derivatives, the tetracarboxylic diimide naphthalene-based compounds described in U.S. Pat. No. 7,422,777 (Shukla et al.), the N,N'-diaryl-substituted 1,4,5,8-naphthalene tetracarboxylic acid diimides having electron withdrawing groups as described in U.S. Pat. No. 7,629,605 (Shukla et al.), N,N'-1,4,5,8-naphthalene tetracarboxylic acid diimides having fluoroalkyl-substituted cycloalkyl groups as described in U.S. Pat. No. 7,649,199 (Shukla et al.), heteropyrenes in p-type semiconductors as described in U.S. Pat. No. 7,781,076 (Shukla et al.), cyclohexyl-substituted naphthalene tetracarboxylic acid diimides as described in U.S. Pat. No. 7,804,087 (Shukla et al.), heterocyclyl-substituted naphthalene tetracarboxylic acid diimides as described in U.S. Pat. No. 7,858,970 (Shukla et al.), and N,N'-arylalkyl-substituted naphthalene-based tetracarboxylic acid diimides as described in U.S. Pat. No. 7,981,719 (Shukla et al.). All of the publications noted in this paragraph are incorporated herein by reference.

The present invention also provides integrated circuits that can comprise a plurality of OFET's prepared according to this invention.

Processing

Organic polymeric multi-metallic alkoxide or aryloxide dielectric layers described herein can be readily processed and are thermally and chemically stable to hot or cold organic solvents. Such composite dielectric layer(s) in the gate dielectric can be deposited by spin coating, ink jetting, or blade coating. The entire process of making the thin film transistors or integrated circuits of the present invention can be carried out below a maximum support temperature of generally 450° C. or less, or typically at 250° C. or less, or even at 150° C. or less. The temperature selection generally depends on the substrate and processing parameters chosen for the given device, once a skilled artisan has the knowledge contained herein. These temperatures are well below traditional integrated circuit and semiconductor processing temperatures, which enables the use of any of a variety of relatively inexpensive supports, such as flexible polymeric supports. Thus, the present invention enables the production of relatively inexpensive integrated circuits containing organic thin film transistors (OFET's) with significantly improved performance.

In the embodiments where materials of semiconductor layers are soluble in coating solvents, both the organic semiconductor layer and the composite gate dielectric layer can be deposited from solution, making the coating of large areas less difficult.

In one embodiment, an OFET structure illustrated in FIG. 1a is prepared by spin coating an organic semiconductor layer onto a dielectric layer prepared according to this invention, which has pre-patterned source and drain electrodes. In another embodiment, an OFET structure illustrated in FIG. 1c is prepared by spin coating an organic semiconductor layer onto the substrate with pre-patterned source and drain electrodes. Then, an organic polymeric multi-metallic alkoxide or aryloxide composite prepared according to this invention is spin coated onto the organic semiconductor layer followed by the deposition of the gate electrode by vacuum deposition or liquid deposition of a conductive metal or metal dispersion, respectively.

Electronic devices in which OFET's and other devices are useful include, for example, more complex circuits such as shift registers, integrated circuits, logic circuits, smart cards, memory devices, radio-frequency identification tags, backplanes for active matrix displays, active-matrix displays (for example liquid crystal or OLED), solar cells, ring oscillators, and complementary circuits, such as inverter circuits. In an active matrix display, a thin film transistor of the present invention can be used as part of voltage hold circuitry of a pixel of the display. In devices containing OFET's, the OFET's are operatively connected by means known in the art.

The present invention further provides a method of making any of the electronic devices described above. Thus, the present invention is embodied in an article that comprises one or more of the described thin film transistors. For example, electronic devices of this invention can be integrated circuits, active-matrix displays, and solar cells comprising a multiplicity of thin-film transistors. In some embodiments, the multiplicity of the thin-film transistors is on a non-participating support that is optionally flexible. The present invention also can be used to prepare an integrated circuit comprising a plurality of thin-film transistors.

The present invention provides at least the following embodiments and combinations thereof, but other combinations of features are considered to be within the present invention as a skilled artisan would appreciate from the teaching of this disclosure:

1. A device comprising a single dielectric layer consisting essentially of an organic polymeric multi-metallic alkoxide or aryloxide composite, comprising:

an organic polymer comprising metal coordination sites, and multi-metallic alkoxide or aryloxide molecules that are coordinated with the organic polymer, the multi-metallic alkoxide or aryloxide molecules being represented by:

wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

2. The device of embodiment 1 further comprising an organic semiconductor layer and the single dielectric layer in physical contact with the organic semiconductor layer.

3. The device of embodiment 1 or 2, wherein the molar ratio of the M metal selected from Group 2 of the Periodic Table to the M metal selected from any of Groups 3 to 12 of the Periodic Table, is at least 0.5:1 to and including 10:1.

4. The device of any of embodiments 1 to 3, wherein the M metal selected from Group 2 of the Periodic Table is barium, strontium, calcium, or a combination thereof.

5. The device of any of embodiments 1 to 4, wherein the M metal selected from any of Groups 3 to 12 and Rows 4 and 5 of the Periodic Table is titanium, zirconium, nickel, copper, zinc, palladium, silver, or lanthanum, or a combination thereof.

6. The device of any of embodiments 1 to 5, wherein the alkoxide comprises a substituted or unsubstituted alkyl group having 1 to 24 carbon atoms, and the aryloxide comprises a substituted or unsubstituted phenyl group.

7. The device of any of embodiments 1 to 6, wherein n is an integer of 2 to and including 4, and x is an integer of at least 2 to and including 4.

8. The device of any of embodiments 1 to 7, wherein the organic polymeric multi-metallic alkoxide or aryloxide composite comprises an organic polymer comprising metal coordination sites that is a poly(meth)acrylate, polyester, or poly(vinyl pyridine).

9. The device of any of embodiments 1 to 8, wherein the organic polymeric multi-metallic alkoxide or aryloxide composite comprises the M metal selected from Group 2 of the Periodic Table that is barium, strontium, or calcium, or a combination thereof, and the M metal selected from any of Groups 3 to 12 and Rows 4 and 5 of the Periodic Table that is titanium, zirconium, nickel, copper, zinc, palladium, silver, lanthanum, or a combination thereof.

10. The device of any of embodiments 1 to 9, wherein the organic polymeric multi-metallic alkoxide or aryloxide composite comprises a substituted or unsubstituted alkyl group having 1 to 24 carbon atoms, and the aryloxide comprises a substituted or unsubstituted phenyl.

11. The device of any of embodiments 1 to 10 comprising an n-type or p-type organic field effect thin film transistor comprising an organic semiconductor layer and the single dielectric layer.

12. The device of any of embodiments 1 to 11 that is a thin film transistor that comprises a gate electrode, the dielectric layer, an organic semiconductor layer, and source and drain electrodes formed on a substrate.

13. The device of any of embodiment 12 wherein the substrate is a glass substrate, silicon wafer, or a polymeric film.

14. A method for preparing a device of any of embodiments 1 to 13, the method comprising:

independently applying a dielectric composition and an organic semiconductor composition to a substrate so that, when dried, the applied dielectric composition forms a single dielectric layer as defined in any of embodiments 1 to 14, that is in physical contact with the applied organic semiconductor composition.

15. The method of claim 14 comprising:

applying the organic polymeric multi-metallic alkoxide or aryloxide composite in the organic solvent to the substrate that is electrically conducting to form a gate dielectric layer, removing the organic solvent from the coated gate dielectric layer, applying the organic semiconductor composition to the gate dielectric layer to form an organic semiconductor layer, and forming one or more sets of electrically conductive source and drain electrodes on the organic semiconductor layer.

16. A process for fabricating a thin-film semiconductor device, comprising:
  providing a substrate,
  providing a gate electrode material over the substrate,
  providing an organic film-forming polymer dielectric gate layer over the gate electrode material,
  depositing a thin film of an organic semiconductor material, and
  providing a source electrode and a drain electrode contiguous to the thin-film of the organic semiconductor material,
    wherein the organic film-forming polymer dielectric gate layer is defined in any of embodiments 1 to 10.

17. The process of claim 16 wherein the substrate is a flexible substrate.

The following Examples are provided to illustrate the practice of this invention and are not meant to be limiting in any manner.

The bi-metallic alkoxides used in the following examples were prepared by following the general method reported by Nagao et al in *Polymer Int.* 60, 1180 (2011). Specific examples are described below.

Bi-Metallic Synthesis 1: Synthesis of Barium Titanium (Methoxyisopropanol)$_6$(BaTi(MIP)$_6$)

Barium metal (5 g) was added to 2-methoxy isopropanol (30 ml) and dissolved by heating under nitrogen for 2 hours. After cooling, titanium isopropoxide (10.36 g) was slowly added and reaction mixture was refluxed under nitrogen atmosphere for 4-8 hours. The resulting solution of BaTi (MIP)$_6$ in 2-methoxy isopropanol had 12.5 weight % of barium was used as such to prepare organic polymeric multi-metallic alkoxide composites of this invention.

Bi-Metallic Synthesis 2: Synthesis of Barium Titanium (Triethylene Glycol Ethyl Ether)$_6$(BaTi(TGEE)$_6$)

Barium metal (5.5 g) was added to a solution of titanium isopropoxide (11.4 g) in triethylene glycol ethyl ether (52 ml) and dissolved by heating under nitrogen for 24 hours. After cooling, a dark yellow solution of BaTi(TGEE)$_6$ having 8.67 weight % of barium in triethylene glycol ethyl ether was obtained, which was then used as such to prepare organic polymeric polymeric multi-metallic alkoxide composites of this invention.

Bi-Metallic Synthesis 3: Synthesis of Strontium Titanium (Methoxyisopropanol)$_6$(SrTi(MIP)$_6$)

Strontium (2.93 g) was added to 2-methoxy isopropanol (30 ml) under an argon atmosphere and heated to reflux. After approximately 4 hours, a clear yellow solution was obtained. Titanium isopropoxide (9.5 g) was added to the reaction mixture using a cannula and the reaction mixture refluxed for 3 hours. After cooling, a pale yellow solution of SrTi(MIP)$_6$, which had 7.47 weight % of strontium in 2-methoxy isopropanol was obtained, which was then used as such to prepare organic polymeric multi-metallic composites of this invention.

Bi-Metallic Synthesis 4: Synthesis of Barium Titanium (Diethylene Glycol Monoethyl Ether)$_6$(BaTi(CARB)$_6$)

Barium (2.93 g) was added to diethylene glycol monoethyl ether (30 ml) under argon atmosphere and heated to reflux. After approximately 4 hours, a clear yellow solution was obtained. Titanium isopropoxide (9.5 g) was added to the reaction mixture and the reaction mixture refluxed for 3 hours. After cooling, a pale yellow solution of BaTi(CARB)$_6$ was obtained, which had 7.47 weight % of barium in diethylene glycol monoethyl ether, and was then used to prepare organic polymeric multi-metallic composites of this invention.

Polymer Synthesis 1: Polymerization of Methyl Methacrylate (91%)(, Octadecyl Methacrylate (6%), and 2-Hydroxyethyl Methacrylate (3%)

A mixture of methyl methacrylate (20.00 g, 199.8 mmol), octadecyl methacrylate (1.38 g, 4.1 mmol), 2-hydroxyethyl methacrylate (0.70 g, 5.3 mmol), 2,2'-azobis(2-methylbutyronitrile) (0.10 g, 0.53 mmol), and chlorobenzene (30 ml) was deaerated with argon for 5 minutes, and then heated under argon in a 70° C. oil bath for 18 hours. The reaction mixture was cooled to room temperature, and the resulting organic polymeric multi-metallic alkoxide was precipitated into excess methanol. The resulting white powder was collected, washed with methanol, and air-dried. The product was re-dissolved in dichloromethane and again precipitated into excess methanol, collected, washed with methanol, and dried in a vacuum oven at 60° C. for 24 hours. The product was obtained as a white powder, 17.5 g (79%). Analysis by size exclusion chromatography (SEC) indicated a weight average molar mass of 153,000 (polystyrene standards). The glass transition temperature was determined to be 112° C. by differential scanning calorimetry (DSC).

Polymer Synthesis 2: Polymerization of Methyl Methacrylate (93%), Octyl Methacrylate (4%), and 2-Hydroxyethyl Methacrylate (3%)

The synthetic procedure of Polymer Synthesis 1 was followed using methyl methacrylate (20.00 g, 199.8 mmol), octyl methacrylate (0.872 g, 4.40 mmol), 2-hydroxyethyl methacrylate (0.65 g, 4.99 mmol), 2,2'-azobis(2-methylbutyronitrile) (0.10, 0.53 mmol), and chlorobenzene (30 ml). The resulting organic polymeric multi-metallic alkoxide product was obtained as a white powder, 16.4 g (77%). Analysis by size exclusion chromatography (SEC) indicated a weight average molar mass of 186,000 (polystyrene standards). The glass transition temperature was determined to be 118° C. by differential scanning calorimetry (DSC).

Polymer Synthesis 3: Polymerization of Methyl Methacrylate (94%), Pentadecafluorooctyl Methacrylate (3%), and 2-Hydroxyethyl Methacrylate (3%)

The procedure of Polymer Synthesis 1 was followed using methyl methacrylate (21.0 g, 209.8 mmol), pentadecafluorooctyl methacrylate (0.67 g, 1.47 mmol), 2-hydroxyethyl methacrylate (0.67 g, 5.13 mmol), 2,2'-azobis(2-methylbutyronitrile) (0.10 g, 0.53 mmol), and chlorobenzene (30 ml). The organic polymeric multi-metallic alkoxide product was obtained as a white powder, 17.4 g (78%). Analysis by size exclusion chromatography (SEC) indicated a weight average molar mass of 199,000 (polystyrene standards). The glass transition temperature was determined to be 124° C. by differential scanning calorimetry (DSC).

Polymer Synthesis 4: Copolymerization of Methyl Methacrylate (98%) with 2-Vinyl Pyridine (2%)

The procedure of Polymer Synthesis 1 was followed using methyl methacrylate (20.0 g, 199.8 mmol), 2-vinyl pyridine (0.44 g, 4.19 mmol), 2,2'-azobis(isobutyronitrile) (0.335 g, 2.04 mmol), and dimethyl formamide (75 ml). The polymeric product was obtained as a white powder, 15.3 g (75%). Analysis by size exclusion chromatography (SEC) indicated a weight average molar mass of 40,400 (polystyrene standards). The glass transition temperature was determined to be 120° C. by differential scanning calorimetry (DSC).

Invention Example 1

Preparation of Poly(Methyl Methacrylate)(PMMA)-BaTi(MIP)$_6$Composite

To a 10 ml solution of PMMA (20 weight %) in anisole, 2.5 ml solution of BaTi(MIP)$_6$ prepared in Bi-Metallic Synthesis 1 was added to obtain a PMMA-BaTi(MIP)$_6$ composite mixture that contained 8.5 weight % of barium. The resulting mixture was diluted by addition of 10 ml of anisole followed by addition of 2.3 ml of 2-methoxy isopropanol and 1.5 ml of carbitol. The solution was mixed by stirring for 12 hours to prepare the desired organic polymeric multi-metallic alkoxide composite.

Invention Example 2

Preparation of Poly(Methyl Methacrylate) (PMMA)-BaTi(TGEE)$_6$Composite

To an 18 ml solution of PMMA (20 weight %) in anisole, a 3.5 ml solution of BaTi(TGEE)$_6$ prepared in Bi-metallic Synthesis 2 was added to obtain a PMMA-BaTi(TGEE)$_6$ composite mixture that contained 7.0 weight % of barium. The mixture was stirred for 2 hours then diluted by addition of 19 ml anisole followed by 3 ml of carbitol. The solution was mixed by stirring for additional 2 hours to provide the desired organic polymeric multi-metallic alkoxide composite.

Invention Example 3

Preparation of Poly[Methyl Methacrylate-Co-(Octyl Methacrylate-Co-(2-Hydroxyethyl Methacrylate)]-BaTi(MIP)$_6$ Composite To a 10 ml solution of the polymer prepared in Polymer Synthesis 2 (20 weight %) in anisole, 5.5 ml of anisole, 3.4 ml of 2-methoxy isopropanol, and 0.4 ml of acetoxy acetone were added. To this solution, 3.0 ml of the solution of BaTi(MIP)$_6$ prepared in Bi-metallic Synthesis 1 was added to obtain a polymer-BaTi(MIP)$_6$ composite mixture that contained 13 weight % of barium. The mixture was further diluted with 12.3 ml of a 1:1 volume % solution of anisole/2-methoxy isopropanol. The solution was mixed by stirring for 12 hours to provide the desired organic polymeric multi-metallic alkoxide composite.

Invention Example 4

Preparation of Poly(Methyl Methacrylate-2-Vinylpyridine) (PMMA-2VP)-BaTi(TGEE)$_6$ Composite To a 5.0 ml solution of PMMA-2VP copolymer (15 weight %) in 1-methoxy-2-propanol (MIP), a 2.0 ml solution of BaTi(TGEE)$_6$ prepared in Bi-metallic Synthesis 2 was added to obtain a PMMA-2VP-BaTi(TGEE)$_6$ composite mixture that contained 6.0 weight % of barium. The mixture was stirred for 3 hours then diluted by addition of 1.0 ml of MIP. The solution was mixed by stirring for additional 2 hours to provide the desired organic polymeric multi-metallic alkoxide composite.

Invention Example 5

Coating of PMMA-BaTi(MIP)$_6$ Composite

The organic polymeric multi-metallic alkoxide composite prepared in Invention Example 1 was filtered through a Whatman 0.45 μm glass microfiber filter into a clean glass vial or container. A filtered solution of the organic polymeric multi-metallic alkoxide composite was spun cast onto samples of a heavily doped silicon wafer substrate for 10 seconds at 2000 rpm and the coating speed was increased over 30 seconds to 4,000 rpm and then spun at this speed for 40 seconds. Each coated doped silicon wafer was then placed onto a hot plate and gradually heated from 50° C. to 120° C. over a period of 10 minutes. The temperature was then increased to 150° C. and was held there for 10 minutes. Each coated sample was gradually cooled to room temperature over a period of 20 minutes. The dry thickness of each organic polymeric multi-metallic alkoxide composite layer was in the range of from 400 nm to 700 nm.

Invention Example 6

Coating of PMMA-BaTi(TGEE)$_6$ Composite

The organic polymeric multi-metallic alkoxide composition prepared in Invention Example 2 was filtered through a Whatman 0.45 μm glass microfiber filter into a clean glass vial or container. A filtered solution of the organic polymeric multi-metallic alkoxide composite was spun cast onto samples of a heavily doped silicon wafer substrate for 10 seconds at 2000 rpm and the coating speed was increased over 30 seconds to 4,000 rpm and spun at this speed for 40 seconds. Each coated doped silicon wafer was then placed on a hot plate and gradually heated from 50° C. to 120° C. over a period of 10 minutes. Finally, the temperature was increased to 150° C. and was held for 10 minutes. Each sample was gradually cooled to room temperature over a period of 20 minutes. The dry thickness of each organic polymeric multi-metallic alkoxide composite layer was in the range of from 400 nm to 700 nm.

Capacitance of each organic polymeric multi-metallic alkoxide composite film was measured with an impedance analyzer (Hewlett Packard 4192A) at a frequency of 10 kHz. Each substrate was a heavily doped Si wafer. Silver layers with an area of $5.21 \times 10^{-7}$ m$^2$ as upper electrodes were patterned on the surface of each composite were deposited in vacuum through a shadow mask. Dielectric constant of the composite film was estimated from the capacitance of the film, area of the silver-electrode and film thickness.

Invention Example 7

Dielectric Constant Evaluations

PMMA-BaTi(MIP)$_6$ organic polymeric multi-metallic alkoxide composites with varying amounts of BaTi(MIP)$_6$ were prepared as described in Invention Example 1 noted above. The organic polymeric multi-metallic alkoxide composite solutions were filtered through a Whatman 0.45 μm glass and then spun cast onto sample of a heavily doped silicon wafer substrate for 10 seconds at 2000 rpm and the coating speed was increased over 30 seconds to 4,000 rpm and spun at this speed for 40 seconds. Each coated doped silicon wafer was then placed on a hot plate and gradually heated from 50° C. to 120° C. over a period of 10 minutes. Finally, the temperature was increased to 150° C. and was held for 10 minutes. Each coated sample was gradually cooled to room temperature over a period of 20 minutes. The dry thickness of each organic polymeric multi-metallic alkoxide composite layer was in the range of from 0.5 μm to 1.5 μm. Silver contacts were deposited through a shadow mask on top of PMMA-BaTi(MIP)$_6$ composites and the capacitance measured for each sample. The dielectric constant of each composite film was estimated from the capacitance of the film, area of the silver-electrode, and dry composite thickness. The results are shown below in TABLE I.

TABLE I

| Weight % Barium Added as BaTi(MIP)$_6$ in PMMA | Dielectric Constant @ 10 kHz of PMMA-BaTi(MIP)$_6$ Composite |
|---|---|
| 0 | 3.1 |
| 12.6 | 3.55 |
| 19 | 3.7 |
| 22 | 3.84 |
| 42 | 4.76 |
| 88 | 10.6 |

It is clear from the data presented in TABLE I that the electrical properties of PMMA are improved upon addition of BaTi(MIP)$_6$ in the resulting organic polymeric multi-metallic alkoxide composite.

Invention Example 8

Preparation of OFET Devices

In order to test the electrical characteristics of the various organic polymeric multi-metallic alkoxide composites, field-effect transistors were typically made using the top-contact geometry shown in FIG. 1b. A heavily doped silicon wafer was used as a substrate and it also served as the gate of the transistor.

Each of several organic polymeric multi-metallic alkoxide composites of the present invention was coated onto Si wafers as described in Invention Examples 2 and 3 and dried. A 0.3 weight % solution of an organic semiconductor, NDI-TPCHEX (shown below and as disclosed in U.S. Pat. No. 7,804,087 of Shukla et al. that is incorporated herein by reference) in a mixture of solvents 1,2,4-trimethylbenzene and N,N'-dimethylaniline (15 volume %) was spin coated onto the inventive composite dielectric layer at 1000 rpm and dried at 70° C. for 15 minutes. Gold or silver contacts having a thickness of 50 nm were then deposited through a shadow mask. The channel width was held at 1000 μm while the channel lengths were varied between 50 μm and 150 μm.

Electrical characterization of the resulting OFET devices was performed with a Hewlett Packard HP 4145B® parameter analyzer. All device measurements were performed in air.

For each analysis performed, between 4 and 12 individual devices were tested using each prepared organic semiconducting layer, and the results were averaged. For each device, the drain current ($I_d$) was measured as a function of source-drain voltage ($V_d$) for various values of gate voltage ($V_g$). For most devices, $V_d$ was swept from 0 V to 80 V for each of the gate voltages measured, typically 0 V, 20 V, 40 V, 60 V, and 80 V. In these measurements, the gate current (Ig) was also recorded in order to detect any leakage current through the device. Furthermore, for each device the drain current was measured as a function of gate voltage for various values of source-drain voltage. For most devices, Vg was swept from 0 V to 80 V for each of the drain voltages measured, typically 40 V, 60 V, and 80 V.

Parameters extracted from the data include field-effect mobility (μ), threshold voltage (Vth), subthreshold slope (S), and the ratio of $I_{on}/I_{off}$ for the measured drain current. The field-effect mobility was extracted in the saturation region, where $V_d > V_g - V_{th}$. In this region, the drain current is given by the equation (see Sze in *Semiconductor Devices-Physics and Technology*, John Wiley & Sons (1981)):

$$I_d = \frac{W}{2L}\mu C_{ox}(V_g - V_{th})^2$$

wherein W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit. Mobilities can also be extracted from the linear region, where $V_d \leq V_g - V_{th}$. Here the drain current is given by the equation (see Sze, noted above):

$$I_d = \frac{W}{L}\mu C_{ox}\left[V_d(V_g - V_{th}) - \frac{V_d^2}{2}\right]$$

For these experiments, mobilities in the linear regime were not extracted, since this parameter is very much affected by any injection problems at the contacts. In general, non-linearities in the curves of $I_d$ versus $V_d$ at low $V_d$ indicate that the performance of the device is limited by injection of charge by the contacts. In order to obtain results that are largely independent of contact imperfections of a given device, the saturation mobility rather than the linear mobility was extracted as the characteristic parameter of device performance.

The log of the drain current as a function of gate voltage was plotted. Parameters extracted from the log $I_d$ plot include

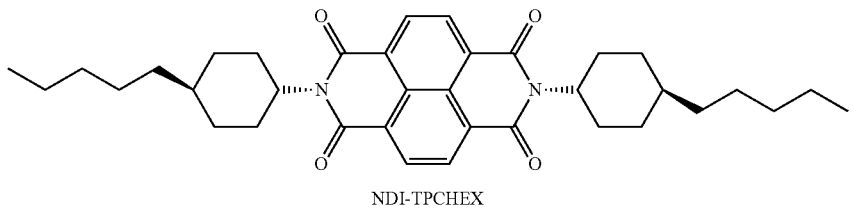

NDI-TPCHEX the $I_{on}/I_{off}$ ratio and the sub-threshold slope (S). The $I_{on}/I_{off}$ ratio is simply the ratio of the maximum to minimum drain current, and S is the inverse of the slope of the $I_d$ curve in the region over which the drain current is increasing (that is, the device is turning on).

The following examples demonstrate that OFET devices comprising inventive organic polymeric multi-metallic alkoxide composite dielectrics exhibited high mobilities and on/off ratios. The mobilities calculated in the saturation region were between 0.9 and 2 cm$^2$/V·sec, with on/off ratios of $10^6$ to $10^7$. In addition to the stable performance, the devices also showed excellent reproducibility.

Invention Example 9

This example demonstrates use of the organic polymeric multi-metallic alkoxide composite of this invention comprising PMMA-BaTi(MIP)$_6$ as a dielectric in an OFET device.

A 0.3 weight % solution of NDI-TPCHEX in a mixture of solvents 1,2,4-trimethylbenzene-N,N'-dimethylaniline (15 volume %) was spin coated on a PMMA-BaTi(MIP)$_6$ composite dielectric layer as described in Invention Example 3. Silver contacts having a thickness of 50 nm were deposited through a shadow mask. The channel width was held at 1000 µm while the channel lengths were varied between 50 µm and 150 µm. The results are described below in TABLE II.

TABLE II

| Dielectric Layer | Dielectric Constant of Composite Layer | Mobility (cm$^2$/Vs) | Vth (V) | $I_{on}/I_{off}$ |
|---|---|---|---|---|
| PMMA-BaTi(MIP)$_6$ (8.5 wt. % Ba) | 3.5 | 0.31 | 16.4 | $3 \times 10^3$ |

Invention Example 10

This example demonstrates the use of another inventive organic polymeric multi-metallic alkoxide composite comprising PMMA-BaTi(CARB)$_6$ as a dielectric in an OFET device.

To a 4 ml solution of PMMA (10%) in carbitol, 1.52 ml of a solution of BaTi(CARB)$_6$ (prepared in Bi-Metallic Synthesis) was added to obtain a composite mixture that had 19 weight % of barium. This mixture was diluted with 0.4 ml of anisole, stirred, and filtered before it was spin casted on a heavily doped Si wafer substrate. The dry thickness of the PMMA-BaTi(CARB)$_6$ dielectric layer was 412 nm.

Figure 2B:
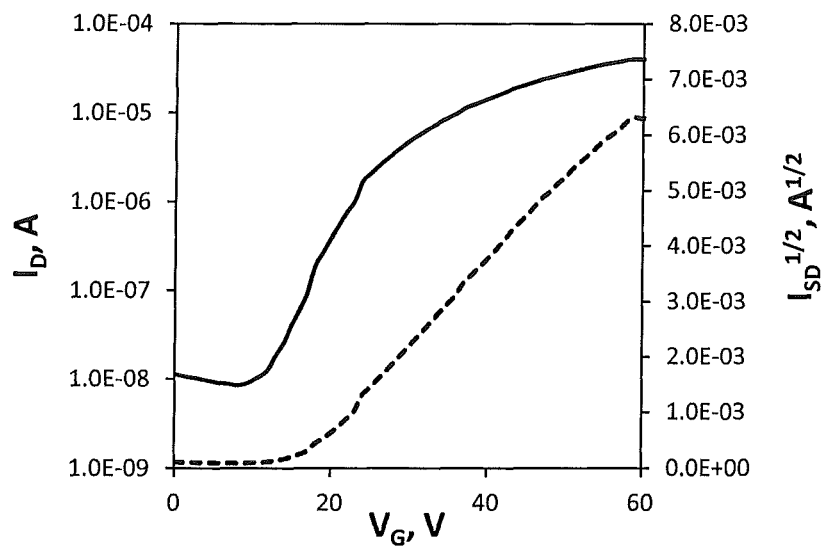

A 0.3 weight % solution of NDI-TPCHEX in a mixture of solvents 1,2,4-trimethylbenzene and N,N'-dimethylaniline (15 volume %) was jetted using MicroFab's Jetlab® II Table Top Printing Platform onto the PMMA-BaTi(CARB)$_6$ composite dielectric layer. Silver contacts having a thickness of 50 nm were deposited through a shadow mask. The channel width was held at 1000 µm while the channel lengths were varied between 50 µm and 150 µm. The output and transfer characteristics of the device are shown in FIG. 2a and FIG. 2b, respectively. The results are shown below in TABLE III.

TABLE III

| Dielectric Layer | Dielectric Constant of Composite Layer | Mobility (cm$^2$/Vs) | Vth (V) | $I_{on}/I_{off}$ |
|---|---|---|---|---|
| PMMA-BaTi(CARB)$_6$ (19 weight % Ba) | 3.7 | 1.2 | 30 | $1 \times 10^3$ |

These results show that the composites of this invention provide suitable dielectric layers but the resulting devices have significantly improved ambient electrical performance.

Invention Example 11

This example demonstrates the use of another inventive organic polymeric multi-metallic alkoxide composite comprising PMMA-2VP-BaTi(TGEE)$_6$ as a dielectric in an OFET device.

To a 5.0 ml solution of PMMA-2VP copolymer (15%) in 1-methoxy-2-propanol (MIP), 2.0 ml of a solution of BaTi (TGEE)$_6$ (prepared in Bi-Metallic Synthesis 2) was added to obtain a composite mixture that had 14 weight % of barium. This mixture was diluted with 1.0 ml of MIP, stirred, and filtered before it was spin casted on a heavily doped Si wafer substrate. The dry thickness of the PMMA-P2VPyr-BaTi (TGEE)$_6$ dielectric layer was 608 nm.

A 0.3 weight % solution of NDI-TPCHEX in a mixture of solvents mestilyene and 1,2,4-trimethylbenzene (25 volume %) was spin casted onto the PMMA-P2VPyr-BaTi(TGEE)$_6$ composite dielectric layer. Silver contacts having a thickness of 50 nm were deposited through a shadow mask. The channel width was held at 1000 µm while the channel lengths were varied between 50 µm and 150 µm. The output and transfer characteristics of the device are shown in FIG. 2a and FIG. 2b, respectively. The results are shown below in TABLE IV.

TABLE IV

| Dielectric Layer | Dielectric Constant of Composite Layer | Mobility (cm$^2$/Vs) | Vth (V) | $I_{on}/I_{off}$ |
|---|---|---|---|---|
| PMMA-P2VPyr-BaTi(TGEE)$_6$ (14 weight % Ba) | 3.7 | $1.2 \times 10^{-1}$ | 31 | $1 \times 10^3$ |

The invention has been described in detail with particular reference to certain preferred embodiments thereof, but it will be understood that variations and modifications can be effected within the spirit and scope of the invention.

The invention claimed is:

1. A device comprising a single dielectric layer consisting essentially of an organic polymeric multi-metallic alkoxide or aryloxide composite, comprising:
   an organic polymer comprising metal coordination sites, and
   multi-metallic alkoxide or aryloxide molecules that are coordinated with the organic polymer, the multi-metallic alkoxide or aryloxide molecules being represented by:

$(M)_n(OR)_x$ wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

2. The device of claim 1 further comprising an organic semiconductor layer and the single dielectric layer in physical contact with the organic semiconductor layer.

3. The device of claim 1, wherein the molar ratio of the M metal selected from Group 2 of the Periodic Table to the M metal selected from any of Groups 3 to 12 of the Periodic Table, is at least 0.5:1 to and including 10:1.

4. The device of claim 1, wherein the M metal selected from Group 2 of the Periodic Table is barium, strontium, calcium, or a combination thereof.

5. The device of claim 1, wherein the M metal selected from any of Groups 3 to 12 and Rows 4 and 5 of the Periodic Table is titanium, zirconium, nickel, copper, zinc, palladium, silver, or lanthanum, or a combination thereof.

6. The device of claim 1, wherein the alkoxide comprises a substituted or unsubstituted alkyl group having 1 to 24 carbon atoms, and the aryloxide comprises a substituted or unsubstituted phenyl group.

7. The device of claim 1, wherein n is an integer of 2 to and including 4, and x is an integer of at least 2 to and including 4.

8. The device of claim 1, wherein the organic polymeric multi-metallic alkoxide or aryloxide composite comprises an organic polymer comprising metal coordination sites that is a poly(meth)acrylate, polyester, or poly(vinyl pyridine).

9. The device of claim 1, wherein the organic polymeric multi-metallic alkoxide or aryloxide composite comprises the M metal selected from Group 2 of the Periodic Table that is barium, strontium, or calcium, or a combination thereof, and the M metal selected from any of Groups 3 to 12 and Rows 4 and 5 of the Periodic Table that is titanium, zirconium, nickel, copper, zinc, palladium, silver, lanthanum, or a combination thereof.

10. The device of claim 1, wherein the organic polymeric multi-metallic alkoxide or aryloxide composite comprises a substituted or unsubstituted alkyl group having 1 to 24 carbon atoms, and the aryloxide comprises a substituted or unsubstituted phenyl.

11. The device of claim 1 comprising an n-type or p-type organic field effect thin film transistor comprising an organic semiconductor layer and the single dielectric layer.

12. The device of claim 1 that is a thin film transistor that comprises a gate electrode, the dielectric layer, an organic semiconductor layer, and source and drain electrodes formed on a substrate.

13. The device of claim 12 wherein the substrate is a glass substrate, silicon wafer, or a polymeric film.

14. The device of claim 1, wherein the organic polymeric multi-metallic alkoxide or aryloxide composite comprises:
an organic polymer comprising metal coordination sites, and
multi-metallic alkoxide or aryloxide molecules that are coordinated with the organic polymer, the multi-metallic alkoxide or aryloxide molecules being represented by:

$(M)_n(OR)_x$ wherein:
the organic polymer comprising metal coordination sites is a poly(meth)acrylate, polyester, or poly(vinyl pyridine),
the molar ratio of the M metal selected from Group 2 of the Periodic Table to the M metal selected from any of Groups 3 to 12 of the Periodic Table, is at least 2:1 to and including 1:1,
wherein the M metal selected from Group 2 of the Periodic Table is barium, strontium, or calcium, or a combination thereof,
the M metal selected from any of Groups 3 to 12 and Rows 4 and 5 of the Periodic Table is titanium, zirconium, nickel, copper, zinc, palladium, silver, lanthanum, or a combination thereof,
the alkoxide comprises a substituted or unsubstituted alkyl group having 1 to 8 carbon atoms, and the aryloxide comprises a substituted or unsubstituted phenyl, and
n is an integer of at least 2 to and including 4, and x is an integer of at least 2 to and including 4.

15. A method for preparing an electronic device comprising:
independently applying a dielectric composition and an organic semiconductor composition to a substrate so that, when dried, the applied dielectric composition forms a single dielectric layer that is in physical contact with the applied organic semiconductor composition, wherein the dielectric composition consists essentially of an organic polymeric multi-metallic alkoxide or aryloxide composite in an organic solvent, the organic polymeric multi-metallic alkoxide or aryloxide composite comprises:
an organic polymer comprising metal coordination sites, and
multi-metallic alkoxide or aryloxide molecules that are coordinated with the organic polymer, the multi-metallic alkoxide or aryloxide molecules being represented by:

$(M)_n(OR)_x$ wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

16. The method of claim 15 comprising:
applying the organic polymeric multi-metallic alkoxide or aryloxide composite in the organic solvent to the substrate that is electrically conducting to form a gate dielectric layer,
removing the organic solvent from the coated gate dielectric layer, applying the organic semiconductor composition to the gate dielectric layer to form an organic semiconductor layer, and
forming one or more sets of electrically conductive source and drain electrodes on the organic semiconductor layer.

17. A process for fabricating a thin-film semiconductor device, comprising:
providing a substrate,
providing a gate electrode material over the substrate,
providing an organic film-forming polymer dielectric gate layer over the gate electrode material,
depositing a thin film of an organic semiconductor material, and
providing a source electrode and a drain electrode contiguous to the thin-film of the organic semiconductor material,
wherein the organic film-forming polymer dielectric gate layer consists essentially of an organic polymeric multi-metallic alkoxide or aryloxide composite that comprises:
an organic polymer comprising metal coordination sites, and
multi-metallic alkoxide or aryloxide molecules that are coordinated with the organic polymer, the multi-metallic alkoxide or aryloxide molecules being represented by:

$(M)_n(OR)_x$ wherein at least one M is a metal selected from Group 2 of the Periodic Table and at least one other M is a metal selected from any of Groups 3 to 12 and Rows 4 and 5 of the Periodic Table, n is an integer of at least 2, R represents the same or different alkyl or aryl groups, and x is an integer of at least 2.

18. The process of claim 17 wherein the substrate is a flexible substrate.

* * * * *

UNITED STATES PATENT AND TRADEMARK OFFICE
CERTIFICATE OF CORRECTION

| | | |
|---|---|---|
| PATENT NO. | : 8,779,415 B2 | Page 1 of 1 |
| APPLICATION NO. | : 13/671893 | |
| DATED | : July 15, 2014 | |
| INVENTOR(S) | : Shukla et al. | |

It is certified that error appears in the above-identified patent and that said Letters Patent is hereby corrected as shown below:

At Title Page at (71) Applicants, delete "Deepoak" and insert -- Deepak --.

At Title Page at (72) Inventors, delete "Deepoak" and insert -- Deepak --.

Signed and Sealed this
Sixteenth Day of December, 2014

Michelle K. Lee
*Deputy Director of the United States Patent and Trademark Office*